(12) United States Patent
Fenouillet-Beranger et al.

(10) Patent No.: US 9,653,476 B2
(45) Date of Patent: May 16, 2017

(54) ON-SOI INTEGRATED CIRCUIT COMPRISING A LATERAL DIODE FOR PROTECTION AGAINST ELECTROSTATIC DISCHARGES

(71) Applicants: Commissariat à l'énergie atomique et aux énergies alternatives, Paris (FR); STMicroelectronics SA, Crolles (FR)

(72) Inventors: Claire Fenouillet-Beranger, Grenoble (FR); Pascal Fonteneau, Theys (FR)

(73) Assignees: Commissariate a l'energie atomique et aux energies alternatives, Paris (FR); STMicroelectronics SA, Montrouge (FR)

( * ) Notice: Subject to any disclaimer, the term of this patent is extended or adjusted under 35 U.S.C. 154(b) by 427 days.

(21) Appl. No.: 13/933,441

(22) Filed: Jul. 2, 2013

(65) Prior Publication Data

US 2014/0017858 A1    Jan. 16, 2014

(30) Foreign Application Priority Data

Jul. 13, 2012   (FR) ...................................... 12 56800

(51) Int. Cl.
*H01L 27/12*  (2006.01)
*H01L 27/02*  (2006.01)

(52) U.S. Cl.
CPC ...... *H01L 27/1203* (2013.01); *H01L 27/0255* (2013.01); *H01L 27/0296* (2013.01); *H01L 27/1207* (2013.01); *H01L 2924/0002* (2013.01)

(58) Field of Classification Search
CPC ............ H01L 27/1207; H01L 27/1203; H01L 2924/0002; H01L 2924/00; H01L 27/0255; H01L 27/0296
USPC ........................................................ 438/152
See application file for complete search history.

(56) References Cited

U.S. PATENT DOCUMENTS 5,923,067 A  *  7/1999  Voldman ...................... 257/349
2001/0033001 A1*  10/2001  Kato .............................. 257/347
2007/0063284 A1*  3/2007  Kawahara et al. ........... 257/351

OTHER PUBLICATIONS

Park et al., "A Novel Simple Shallow Trench Isolation (SSTI) Technology Using Hish Selective CeO2 Slurry and Liner SiN as CMP Stopper", 1999 Symposium on VLSI Digest of Technical Papers, pp. 159-160 (1999).*

* cited by examiner

*Primary Examiner* — Bilkis Jahan
*Assistant Examiner* — Victor Barzykin
(74) *Attorney, Agent, or Firm* — Occhiuti & Rohlicek LLP

(57) ABSTRACT

An integrated circuit includes a transistor, an UTBOX buried insulating layer disposed under it and a ground plane disposed under the layer. A well is disposed under the plane and a first trench is at the periphery of the transistor and extends through the layer into the well. There is a substrate under the well and a p-n diode on a side of the transistor. The diode comprises first and second zones of opposite doping and the first zone is configured for electrical connection to a first electrode of the transistor. The first and second zones are coplanar with the plane and a second trench for separating the first and second zones. The second trench extends through the layer into the plane to a depth less than an interface between the plane and the well. There is a third zone under the second trench forming a junction between the zones.

17 Claims, 8 Drawing Sheets

AA'

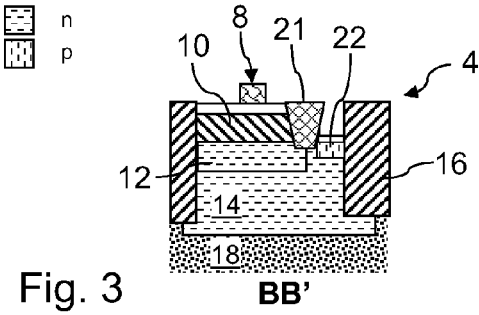
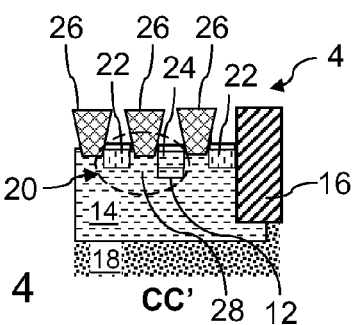
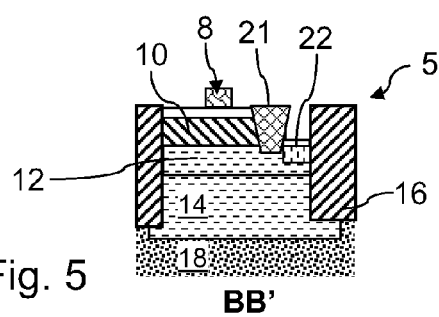
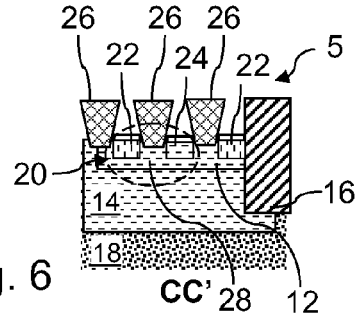
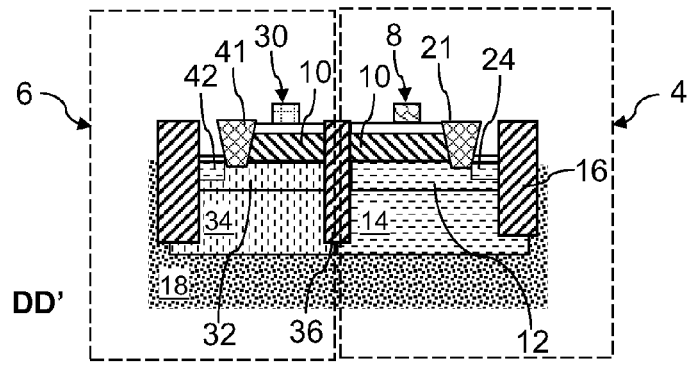
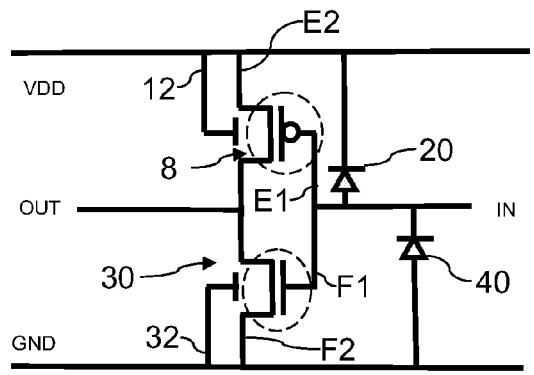

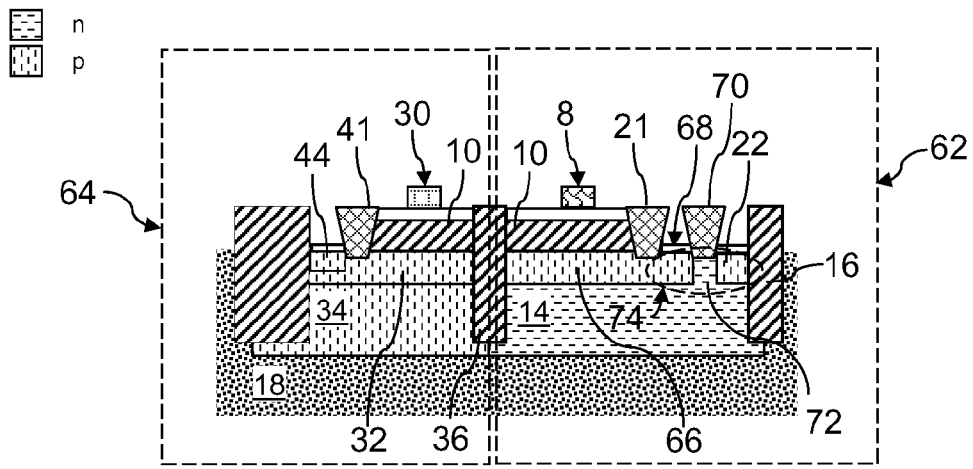
EE'    Fig. 11
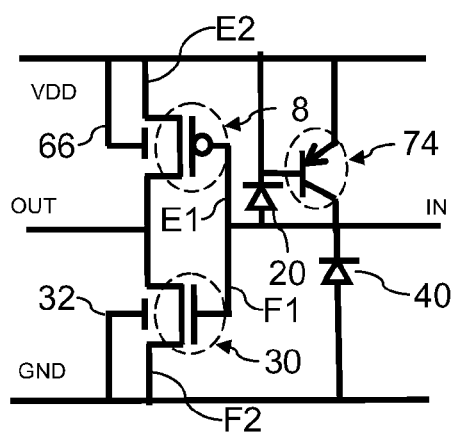
Fig. 12
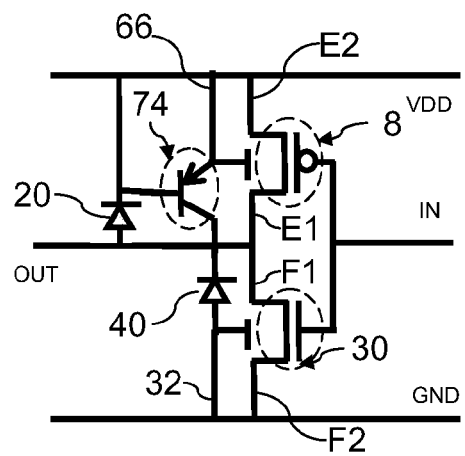
Fig. 13

ON-SOI INTEGRATED CIRCUIT COMPRISING A LATERAL DIODE FOR PROTECTION AGAINST ELECTROSTATIC DISCHARGES

RELATED APPLICATIONS

Under 35 USC 119, this application claims the benefit of the priority date of French Application No. 1256800, filed on Jul. 13, 2012, the contents of which are herein incorporated by reference.

FIELD OF INVENTION

The invention relates to integrated circuits, and in particular to integrated circuits produced on a substrate of silicon-on-insulator (SOI) type. SOI technology consists in separating a slender silicon layer (a few nanometres) on a silicon substrate by a relatively thick layer of insulant (a few tens of nanometres as a general rule).

BACKGROUND

Integrated circuits produced by SOI technology exhibit a certain number of advantages. Such circuits generally exhibit lower electrical consumption for equivalent performance. Such circuits also induce lower parasitic capacitances, which make it possible to improve switching speed. Moreover, the phenomenon of parasitic triggering ("latchup") encountered by MOS transistors in Bulk technology can be avoided. Such circuits therefore turn out to be particularly suitable for applications of SoC or MEMS type. It is also noted that SOI integrated circuits are less sensitive to the effects of ionizing radiations and thus turn out to be more reliable in applications where such radiations may induce operational problems, in particular in space applications. SOI integrated circuits can in particular comprise random-access memories of SRAM type or logic gates.

The reduction in the static consumption of logic gates while increasing their toggling speed forms the subject of much research. In the course of development, certain integrated circuits integrate at one and the same time logic gates with low consumption and logic gates with high toggling speed. To generate these two types of logic gates on one and the same integrated circuit, the threshold voltage (abbreviated $V_T$) of certain transistors of the logic gates with fast access is lowered, and the threshold voltage of other transistors of the logic gates with low consumption is increased. In Bulk technology, the modulation of the threshold voltage level of transistors of the same type is performed by differentiating the doping level of their channel. However, in FDSOI (for "Fully Depleted Silicon On Insulator") technology, the doping of the channel is almost zero ($10^{15}$ cm$^{-3}$). Thus, the doping level of the channel of the transistors therefore cannot exhibit any significant variations, thus preventing the threshold voltages from being differentiated in this way. A solution proposed in certain studies in order to produce transistors of the same type with distinct threshold voltages is to integrate different gate materials for these transistors. However, the practical production of an integrated circuit such as this turns out to be technically tricky and economically prohibitive.

SUMMARY OF THE INVENTION

In order to have distinct threshold voltages for different transistors in FDSOI technology, it is also known to use a biased ground plane disposed between a thin insulating oxide layer and the silicon substrate. By altering the doping of the ground planes and their bias, it is possible to define a range of threshold voltages for the different transistors. This will therefore yield transistors with low threshold voltage termed LVT (for "Low $V_T$" typically 400 mV), transistors with high threshold voltage termed HVT (for "High $V_T$" typically 550 mV) and transistors with medium threshold voltage termed SVT (for "Standard $V_T$" typically 450 mV) or RVT (for "Regular $V_T$").

To allow the operation of the different transistors, it is necessary to electrically insulate them from one another. Consequently, the transistors are generally surrounded by isolation trenches (designated by the acronym STI for "Shallow Trench Isolation") which extend to below the wells.

In a known manner, integrated circuits such as these also include devices for protection against accidental electrostatic discharges (ESD) that might impair these transistors.

The document US2007/063284 describes an integrated circuit comprising an FDSOI transistor made on an insulating layer of UTBOX type. A semi-conducting ground plane is disposed under the buried insulating layer. A well is disposed under this ground plane. An isolation trench is made at the periphery of the transistor through the insulating layer and extends into the well. Another isolation trench extends through the insulating layer, without reaching the well. A diode is made on the side of the transistor on the basis of two semi-conducting zones of opposite dopings in contact with one another to form a diode.

Another example of such a protection device is that described by Akram A. Salman et al. in the article entitled "ESD Protection for SOI Technology using Under-the-BOX (substrate) Diode Structure" and published in the journal "IEEE Transactions on Device and Materials Reliability", vol. 6, No. 2, June 2006. In this example, the device comprises a p-n diode, made on a side of the transistor and under the insulating layer. This p-n diode comprises first and second semi-conducting zones, of opposite dopings, between which extends a third semi-conducting zone of lower doping level. The first and second zones exhibit respective electrical contacts, separated from one another by an isolation trench extending on the top of the insulating layer.

This device nonetheless presents certain drawbacks. On the one hand, the electrical performance of the diode is degraded by the presence of significant leakage currents between the first and second semi-conducting zones, and this may affect the performance of the diode. Moreover, the fabrication methods typically employed offer only restricted control of the width of the diode, this having the drawbacks on the one hand of limiting the number of such diodes that can be produced on a given surface of the circuit, and on the other hand of restricting control of electrical properties of the said diode, such as for example the breakdown voltage or the leakage. Finally, the isolation trench is apt to be damaged during steps of fabricating the integrated circuit. Indeed, the fabrication methods comprise steps of forming and removing insulating masks which are apt to structurally degrade lateral edges of the said trench.

The invention is aimed at solving one or more of these drawbacks. The invention thus pertains to an integrated circuit such as defined in the appended claims.

BRIEF DESCRIPTION OF THE DRAWINGS

Other characteristics and advantages of the invention will emerge clearly from the description thereof given hereinafter, by way of wholly nonlimiting indication, with reference to the appended drawings, in which;

FIG. 3 and 5 illustrate embodiments of the component of FIG. 2, viewed on the sectional plane B-B' of FIG. 1;

FIG. 4 and 6 illustrate embodiments of the component of FIG. 2, viewed on the sectional plane C-C' of FIG. 1;

FIG. 7 illustrates a view of the circuit of FIG. 1 on the sectional plane D-D';

FIG. 8 is an electrical diagram corresponding to the circuit of FIG. 1 according to a first embodiment;

FIG. 11 illustrates a view of the circuit of FIG. 10 on the sectional plane E-E';

FIG. 12 is an electrical diagram corresponding to the circuit of FIG. 11 according to a first embodiment;

FIG. 13 is an electrical diagram corresponding to the circuit of FIG. 11 according to a second embodiment;

DETAILED DESCRIPTION OF THE INVENTION

The invention proposes to use, in an integrated circuit, isolation trenches of restricted depth and dimensions to produce ESD protection devices for the integrated circuit, these protection devices exhibiting improved structural and electrical properties.

Figure 1:
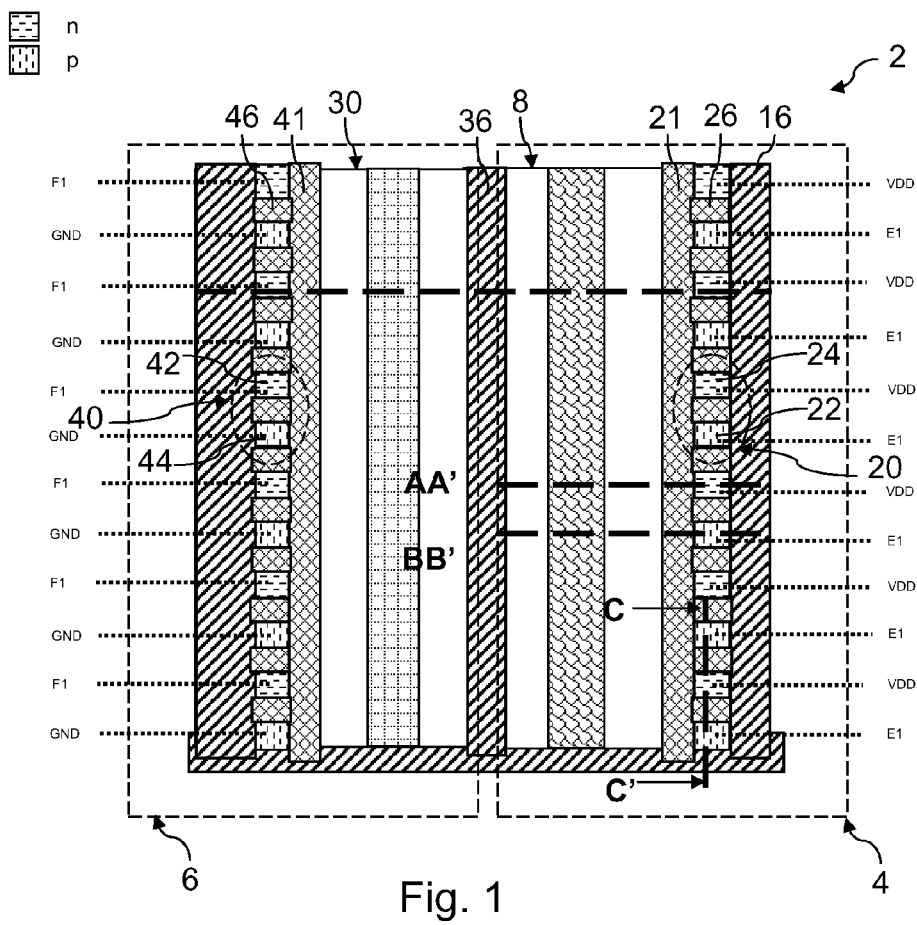
FIG. 1 illustrates an integrated circuit.
Figure 2:
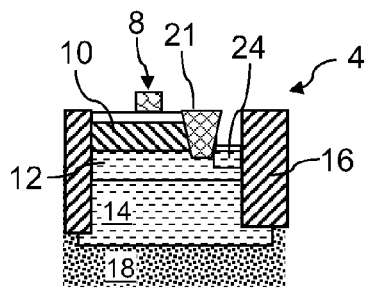
FIG. 2 illustrates a view of a component of the circuit of FIG. 1 on the sectional plane A-A'.

FIG. 1 represents an integrated circuit 2 fabricated on SOI. In this example, this circuit 2 comprises components 4 and 6.

FIGS. 2 to 6 describe the first component 4 in greater detail. This component 4 comprises:
- a field-effect metal oxide semi-conductor (MOS) transistor 8, of FDSOI technology;
- a buried insulating layer 10 of UTBOX ("Ultra-Thin Buried Oxide Layer") type, formed plumb with the 30 transistor 8;
- a semi-conducting ground plane 12, formed plumb with the insulating layer 10;
- a semi-conducting well 14, formed plumb with the ground plane 12;
- an isolation trench 16 of STI type;
- a semi-conducting substrate 18, situated under the well 14.

The transistor 8 comprises a layer of a semi-conducting material, termed the active layer, formed on the insulating layer 10 and plumb with this insulating layer 10. To simplify the drawings, the detailed structure of this active layer is not represented therein. This active layer can comprise in a manner known per se a weakly doped semi-conducting material channel, with a concentration of dopants that is substantially equal to the concentration of dopants of the substrate 18. The transistor 8 also comprises gate, source and drain electrodes.

The buried insulating layer 10 electrically insulates the transistor 8 from the ground plane 12, from the well 14 and from the substrate 18.

The ground plane 12 is configured to be voltage-biased, typically by way of a control circuit not represented here. The bias of the ground plane 12 makes it possible to control the threshold voltage of the transistor 8.

The trench 16 is made at the periphery of the transistor 8 and extends depth-wise through the insulating layer 10 and into the well 14.

The component 4 is able to protect the transistor 8 against electrostatic discharges that may arise on one or more electrodes of the transistor 8. For this purpose, the component 4 comprises a p-n junction diode 20, made on a side of the transistor 8 and separated from this transistor 8 by an isolation trench 21. This diode 20 comprises first 22 and second 24 semi-conducting zones, exhibiting opposite types of doping. These zones 22 and 24 are coplanar with the ground plane 12. Coplanar is understood to mean that it is possible to define a plane parallel to the layer 10 and passing through the zones concerned. The zone 22 is connected electrically to a first electrode E1 of the transistor 8. The zone 24 is connected electrically to a second electrode E2 of the transistor 8.

The component 4 furthermore comprises a second isolation trench 26, to mutually separate the zones 22 and 24 of the diode 20. This trench 26 is formed of an electrically insulating material. This trench 26 extends through the insulating layer 10 and into the ground plane 12 and until a depth strictly less than the interface between the ground plane 12 and the well 14. In this description, the depth under the insulating layer 10 is defined with respect to a plane extending along the interface separating the insulating layer 10 and the ground plane 12 and along a vertical direction, perpendicular to the direction of the plane of the substrate 18.

The component 4 also comprises a third semi-conducting zone 28. This zone 28 extends under the trench 26 and forms a first semi-conductor junction between the zones 22 and 24. This zone 28 allows the flow of electric charge carriers between the zones 22 and 24. The diode 20 can be considered to be planar, on account of the presence of the semi-conducting zones 22, 24 and 28 side-by-side in one and the same layer of the circuit.

The trench 26 extends through the insulating layer 10 and under the insulating layer 10, while exhibiting a substantially lesser depth than that of the trench 16. This makes it possible to attenuate the occurrence of leakage currents between the zones 22 and 24 and to improve the electrical performance of the diode 20.

Moreover, the lateral dimension of such a trench 26 may be reduced. The lateral dimension of the trench 26 here designates the smallest distance separating the zones 22 and 24 from one another. This reduction in the lateral dimension makes it possible on the one hand to improve the control of certain electrical properties of the diode 20, such as the breakdown voltage, and on the other hand to reduce the space occupied by the circuit 2. In particular, if the diode were produced with an isolation trench made on the insulating layer 10 without passing through the insulating layer 10, the lateral dimension of the isolation trench could not be as easily reduced without some degradation of the electrical performance of the diode.

For example, with the FDSOI fabrication methods typically used for the 20 nm technological node, the trench 26 can exhibit a lateral dimension of less than 70 nm.

Moreover, by limiting the depth of the trench 26 to a depth substantially less than that of the trench 16, the electrical performance of the diode 20 can be improved, in particular by limiting the transit time of charge carriers flowing in the zone 28 between the zones 22 and 24, and by thus improving the protection of the component 4 against electrostatic discharges by limiting the maximum value of overintensity.

Here, this trench 26 extends to a depth of 80 nm, 70 nm, or 60 nm and, preferably, less than or equal to 50 nm below the interface separating the insulating layer 10 from the ground plane 12. The lateral dimension of this trench 26 is less than or equal to 150 nm or 100 nm and, preferably, less than or equal to 70 nm.

As illustrated in FIG. 4, the zone 28 is here formed by a prolongation of the well 14. This prolongation extends laterally beyond the trench 21, and then in the vertical direction as far as the trench 26. The trench 21 and the trench 26 exhibit one and the same depth.

Here, the component 4 comprises a plurality of zones 22 and 24, made along the transistor 8. These zones 22 and 24 form a plurality of mutually contiguous diodes 20. Two contiguous diodes 20 exhibit a common zone 22 or 24. To simplify FIGS. 1, 4 and 6, just one diode 20 is highlighted (surrounded by a dashed line).

FIGS. 5 and 6 illustrate a component 5 that may be used in place of the component 4. In this component 5, the zone 28 is formed by lateral prolongation (direction parallel to the plane of the substrate 18) of the ground plane 12 beyond the trench 21. Thus, the diode 20 exhibits a reduced breakdown voltage.

In these examples, the transistor 8 is an FDSOI transistor of p-MOS type. The transistor 8 exhibits a gate length of 20 nm. The insulating layer 10 exhibits a thickness of less than or equal to 60 nm, less than or equal to 50 nm, or indeed less than or equal to 20 nm. The insulating layer 10 as well as the trenches 16 and 26 are made of silicon oxide in these examples. The ground plane 12 and the well 14 exhibit dopings of type n, with the concentrations of dopants lying:

between $10^{16} cm^{-3}$ and $10^{18} cm^{-3}$ for the well 14 ;
between $10^{18} cm^{-3}$ and $10^{19} cm^{-3}$ for the ground plane 12.

Here, with these choices of type of doping of the ground plane 12 and of the well 14, the transistor 8 exhibits a range of threshold voltages of RVT type, that is to say it exhibits a threshold voltage of intermediate value, typically lying between 0.35V and 0.45V. Here, the substrate 18 is made of silicon with a doping of type p, and exhibits a dopants concentration of less than or equal to $10^{16} cm^{-3}$ and, preferably, less than or equal to $3*10^{15} cm^{-3}$. The well 14 extends to a depth of less than 1 µm and, preferably, less than or equal to 700 nm.

The zones 22 and 24 exhibit here, respectively, dopings of types p and n. These zones 22 and 24 extend perpendicularly to a direction normal to the substrate over a depth of at most equal to 110 nm or 100 nm. This depth is here defined in the vertical direction, with respect to the plane extending along the interface between the insulating layer 10 and the ground plane 12. A metallic contact is here deposited directly on each of the zones 22 and 24, in order to allow electrical connection of each of these zones 22, 24 to an electrical circuit.

Advantageously, the zones 22 and 24 each exhibit a concentration of dopants that is at least fifty times, or sixty times, or a hundred times greater than the concentration of dopants of the well 14. For example, the zones 22 and 24 exhibit concentrations of dopants advantageously greater than or equal to $5*10^{18} cm^{-3}$ and, preferably, lying between $10^{19} cm^{-3}$ and $10^{21} cm^{-3}$. These concentrations of dopants are for example substantially equal to the concentrations of dopants of the source or of the drain of the transistor 8.

FIG. 7 represents the component 6 in greater detail. This component 6 is identical to the component 4, except that the types of the dopings of the transistor, of the ground plane of the well and of the semi-conducting zones are different. Thus, the component 6 comprises:
- a field-effect metal oxide semi-conductor (MOS) transistor 30, of FDSOI technology and of opposite type to the transistor 8;
- the insulating layer 10, also extending plumb with the transistor 30;
- a semi-conducting ground plane 32, formed plumb with the insulating layer 10 and exhibiting an opposite doping to the ground plane 12;
- a semi-conducting well 34, formed plumb with the ground plane 32 and exhibiting an opposite doping to the well 14;
- an isolation trench 36, that may exhibit an identical depth and composition to the trench 16, and disposed so as to separate the components 4 and 6.

The transistor 30 is here an FDSOI transistor of n-MOS type. This transistor 30 here presents a gate length of greater than or equal to 20 nm.

The component 6 also comprises a diode 40, identical to the diode 20, except that it is made on a side of the transistor 30 and separated from this transistor 8 by an isolation trench 41, of identical depth, thickness and/or composition to the trench 21. This diode 40 comprises semi-conducting zones 42 and 44 of opposite dopings, and separated by an isolation trench 46 similar to the trench 26. This diode 40 also comprises a third semi-conducting zone (not represented in this figure), similar to the zone 28 and linking the zones 42 and 44. The zones 42 and 44 are connected electrically, respectively, to electrodes F1 and F2 of the transistor 30. The zones 42 and 44 exhibit, respectively, dopings of types n and p. Here, the third semi-conducting zone of this component 6 is formed by a prolongation of the ground plane 32 laterally beyond the trench 41, and then in the vertical direction as far as the trench 46.

In this example, the transistors 8 and 30 are connected together so that the circuit 2 comprises a logic inverter of CMOS ("Complementary Metal Oxide Semiconductor") type. In a known manner, such a logic inverter exhibits an input IN, configured to receive an input logic signal and an output OUT, configured to return a logic signal corresponding to the logical inverse of the input signal. Such an inverter can in particular be used as input/output interface of an integrated circuit. For this purpose, in this circuit 2:
  the respective gates of the transistors 8 and 30 are connected electrically together and connected electrically to the input IN, the respective drains of the transistors 8 and 30 are connected electrically together and connected electrically to the output OUT, and the sources of the transistors 8 and 30 are, respectively, electrically biased to a supply voltage VDD and to a ground GND of the circuit 2;

the substrate 18 is connected electrically to the ground GND.

The diodes 20 and 40 are here used to form an electrical protection device for the transistors 8 and 30 of the circuit 2. This device is configured to protect the transistors 8 and 30 against electrostatic discharges and to evacuate these electrostatic discharges towards electrical power supply rails (not represented in the drawings) of the circuit 2. Here, these power supply rails are linked electrically to the ground GND and to a source providing the supply voltage VDD. In a known manner, the circuit 2 comprises a central protection making it possible in particular to evacuate electrostatic discharges arising between the power supply VDD and ground GND rails.

FIG. 8 represents a first exemplary use of the diodes 20 and 40 to protect the circuit 2. The diodes 20 and 40 are connected so as to protect more specifically the input IN of the circuit 2. For this purpose:

the electrodes E1 and F1 correspond, respectively, to the gates of the transistors 8 and 30;

the electrodes E2 and F2 correspond, respectively, to the sources of the transistors 8 and 30;

the ground planes 12 and 32 are connected electrically, respectively, to the electrodes E2 and F2;

the anodes of the diodes 20 and 40 are, respectively, connected electrically to the electrodes E1 and F2;

the cathodes of the diodes 20 and 40 are, respectively, connected electrically to the electrodes E2 and F1.

An exemplary operation of this protection device will now be briefly described. For example, during normal operation, the input IN of the circuit is taken to an electrical potential substantially equal either to the ground GND, or to the voltage VDD. The diodes 20 and 40 are therefore in a state not allowing passage of electric current.

In the presence of a significant electrostatic discharge on the input IN and positive with respect to the ground GND, the electrical potential of this input IN can be increased up to a value greater than the voltage VDD.

In this case, on account of the electrical potential difference present across its terminals, the diode 20 is in a state allowing an electric current to pass. A local evacuation path is thus formed, before benefiting from the central protection. The central protection thereafter allows the current to evacuate from VDD to GND. For an electrostatic discharge inducing a voltage of less than the voltage GND on the input IN, the diode 40 is in a passing state. The electric current corresponding to the electrostatic discharge can thus be evacuated by the diodes 20 or 40 by short-circuiting the transistors 8 and 30.

Figure 9:
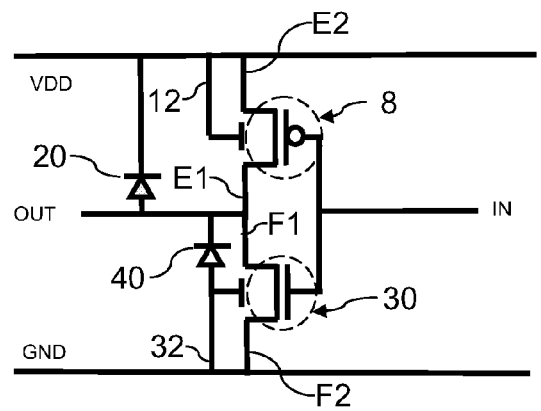
FIG. 9 is an electrical diagram corresponding to the circuit of FIG. 1 according to a second embodiment.

FIG. 9 represents another exemplary use of the diodes 20 and 40 to protect the circuit 2. The diodes 20 and 40 are here connected so as to protect more specifically the output OUT of the circuit 2. For this purpose:

the electrodes E1 and F1 correspond, respectively, to the drains of the transistors 8 and 30;

the electrodes E2 and F2 correspond, respectively, to the sources of the transistors 8 and 30;

the ground planes 12 and 32 are connected electrically, respectively, to the electrodes E2 and F2;

the anodes of the diodes 20 and 40 are, respectively, connected electrically to the electrodes E1 and F2;

the cathodes of the diodes 20 and 40 are, respectively, connected electrically to the electrodes E2 and F1.

In the presence of a significant electrostatic discharge on the output OUT and positive with respect to the ground GND, the electrical potential of this output OUT can be lowered down to a value of less than the voltage GND. In this case, on account of the electrical potential difference present across its terminals, the diode 40 is in a state allowing an electric current to pass. For an electrostatic discharge inducing a voltage of greater than the voltage VDD on the output OUT, the diode 20 is in a passing state. A local evacuation path is thus formed, before benefiting from the central protection. The central protection thereafter allows the current to evacuate from the VDD rail to the GND rail. The electric current corresponding to the electrostatic discharge can thus be evacuated by the diodes 20 or 40 by short-circuiting the transistors 8 and 30.

Figure 10:
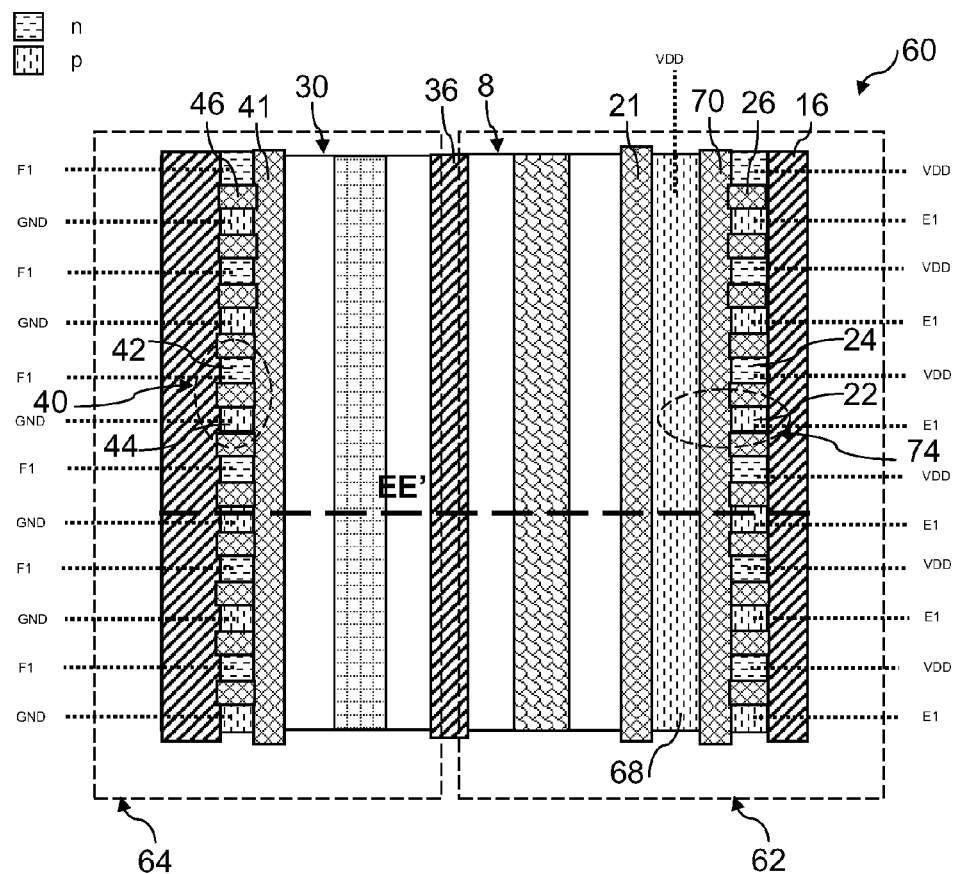
FIG. 10 illustrates another embodiment of the circuit of FIG. 1.

FIG. 10 represents an integrated circuit 60, able to replace the circuit 2 and comprising a device for protection against electrostatic discharges. This circuit 60 comprises components 62 and 64. This circuit 60 is substantially identical to the circuit 2, except that the protection device is distinct from that of the circuit 2.

FIG. 11 represents these components 62 and 64 in greater detail. The component 62 is identical to the component 4, except that:

the ground plane 12 is replaced with a ground plane 66 exhibiting a doping of opposite type, the doping of the ground plane 66 then being chosen to be of the same type as that of the zone 22;

the component 62 furthermore comprises:

an electrical contact 68, for applying to the ground plane 66 one or the other of the voltage VDD or of the ground GND;

an isolation trench 70, of identical depth, thickness and/or composition to the trench 26 and separating the ground plane 66 from the zones 22 and 24;

a semi-conducting zone 72, forming a junction between the zone 22 and the ground plane 66 so as to form a bipolar transistor 74 between the ground plane 66 and the zone 22.

the zone 28 is formed by a lateral prolongation of the well 14 with respect to the trench 70, extending vertically as far as the trench 26;

The component 64 is here identical to the component 6.

In this example, the zone 72 is formed by a prolongation of the well 14 in the vertical direction. This zone 72 exhibits a doping of type n, so that the transistor 74 is a bipolar transistor of PNP type.

The diodes 20 and 40 and the transistor 74 are here used to form an electrical protection device for the transistors 8 and 30 of the circuit 60 distinct from that of the circuit 2. The use of the transistor 74 in this protection device makes it possible to improve the evacuation of electric current in case of electrostatic discharge. In particular, the transistor 74 exhibits a gain in current, which makes it possible to obtain faster evacuation of the current. The transistor 74 also makes it possible to propose a local extra path for protection during negative overvoltages on the terminal IN with respect to the voltage VDD (or positive overvoltage on VDD with respect to the terminal IN). Indeed, within the framework of conventional central protection, the overvoltage is clipped by the diode 40 and the power supply protection, compelling the current to flow in the power supply rails. The voltage drop related to the non-zero resistance of these rails limits the overall performance of the protection. The transistor 74 allows a direct local path between VDD and IN using the phenomenon of transistor snapback current. During a positive overvoltage on VDD, the junction between the zone 24 and 72 is reversed, the leakage current or ionization current through impact then makes it possible to locally increase the potential of the well 72 engaging the bipolar between VDD and IN.

FIG. 12 represents a first exemplary device for protecting the circuit 60. The diodes 20 and 40 and the transistor 74 are connected so as to protect more specifically the input IN of the circuit 60. For this purpose:

the electrodes E1 and F correspond, respectively, to the gates of the transistors 8 and 30;

the electrodes E2 and F2 correspond, respectively, to the sources of the transistors 8 and 30;

the ground planes 66 and 32 are connected electrically, respectively, to the electrodes E2 and F2;

the anodes of the diodes 20 and 40 are, respectively, connected electrically to the electrodes E1 and F2;

the cathodes of the diodes 20 and 40 are, respectively, connected electrically to the electrodes E2 and F1;

base, collector and emitter of the transistor 74 are respectively connected electrically to the cathode of the diode 20, to the electrodes E1 and E2.

When the diode 20 enters a passing state, the transistor 74 in turn enters a passing state, on account of the current applied to its base. Thus, the discharge can be evacuated, greatly limiting the occurrence of overintensity. When the diode 20 is reverse biased, the leakage current flowing through this diode 20 engages the transistor 74 bringing about the phenomenon of snapback current, thereby making it possible to evacuate the discharge while greatly limiting the overintensity.

FIG. 13 represents another example of the circuit 60. The diodes 20 and 40 and the transistor 74 are connected so as to protect more specifically the output OUT of the circuit 60. This circuit is identical to that described in FIG. 12, except that the electrodes El and F1 correspond, respectively, to the drains of the transistors 8 and 30.

When the diode 20 enters a passing state, the transistor 74 in turn enters a passing state, on account of the current applied to its base. Thus, the discharge can be evacuated, greatly limiting the occurrence of overintensity. When the diode 20 is reverse biased, the leakage current flowing through this diode 20 engages the transistor 74, bringing about in its turn the phenomenon of snapback current.

Figure 14:
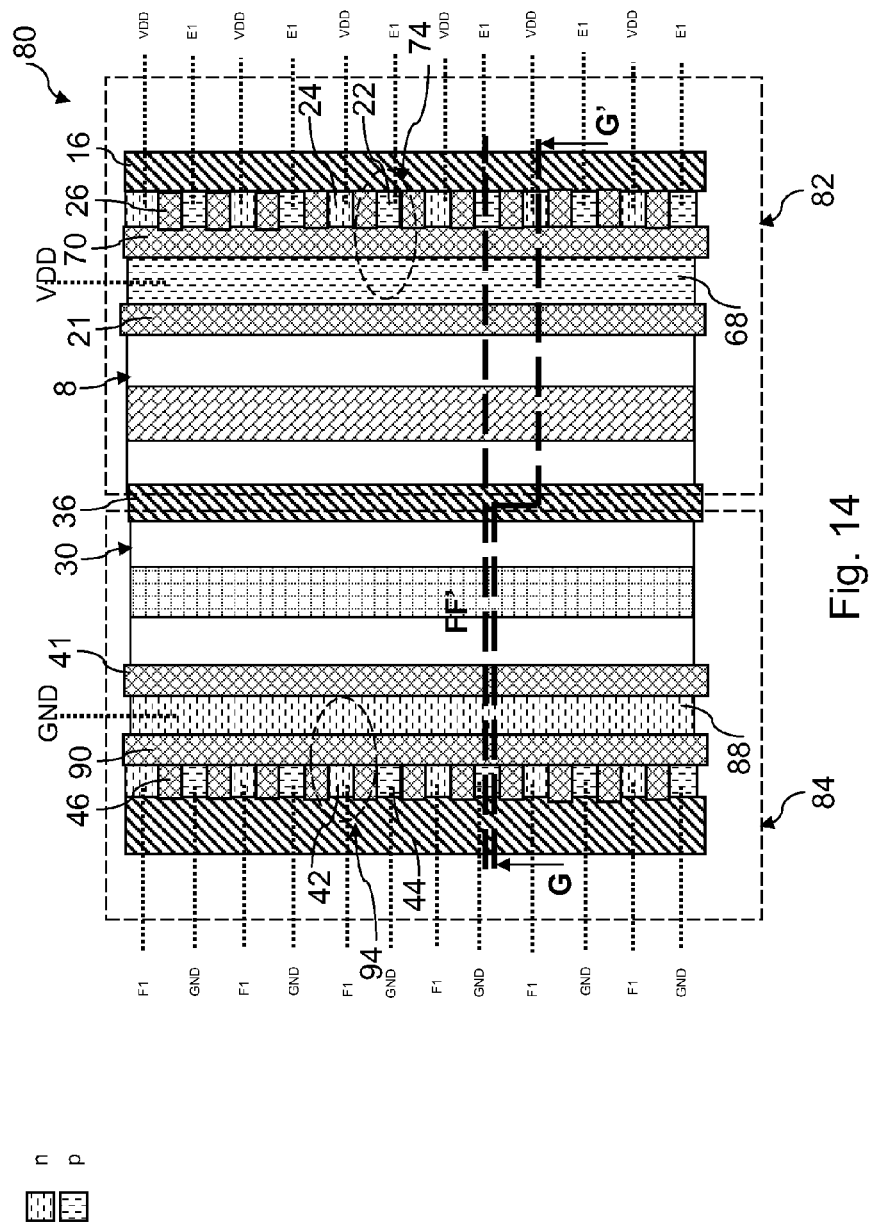
FIG. 14 illustrates another embodiment of the circuit of FIG. 1.

FIG. 14 represents an integrated circuit 80, able to replace the circuits 60 or 2 and comprising a device for protection against electrostatic discharges. This circuit 80 comprises components 82 and 84. This circuit 80 is substantially identical to the circuit 60, except that the protection device is distinct from that of the circuit 60.

Figure 15:
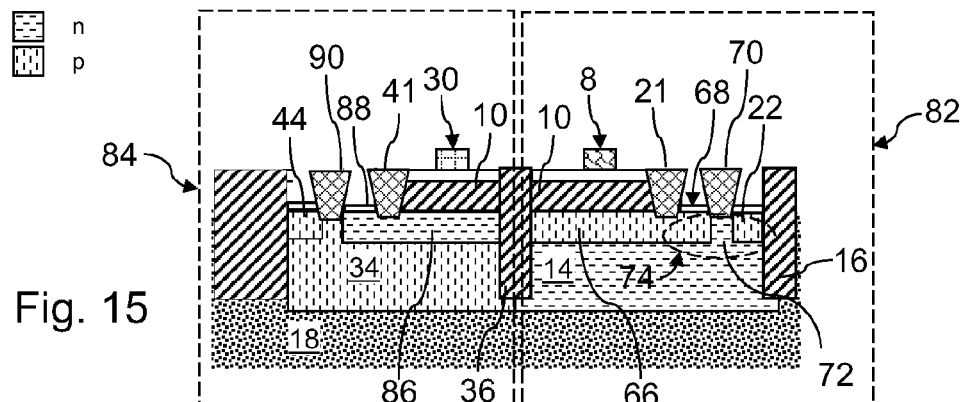
FIG. 15 illustrates a view of the circuit of FIG. 14 on the sectional plane F-F'.
Figure 16:
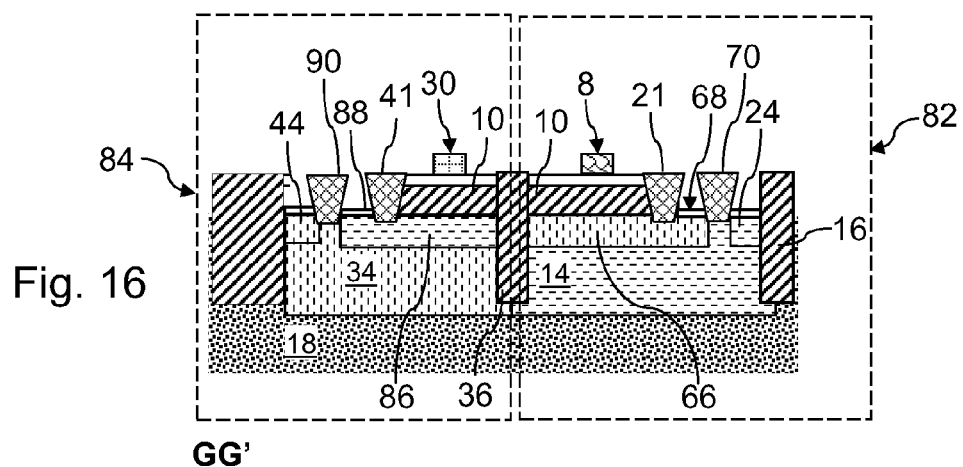
FIG. 16 illustrates a view of the circuit of FIG. 14 on the sectional plane G-G'.

FIGS. 15 and 16 represent these components 82 and 84 in greater detail.

The component 82 is here identical to the component 62.

The component 84 is substantially identical to the component 64, except that:

the ground plane 32 is replaced with a ground plane 86 exhibiting a doping of opposite type, the doping of the ground plane 86 then being chosen to be of the same type as that of the zone 42;

the component 84 furthermore comprises:

an electrical contact 88, for applying to the ground plane 86 one or the other of the voltage VDD or of the ground GND;

an isolation trench 90, of identical depth, thickness and/or composition to the trench 26 and separating the ground plane 86 from the zones 42 and 44;

a semi-conducting zone forming a junction between the zone 42 and the ground plane 86 so as to form a bipolar transistor 94 (not visible in FIGS. 15 and 16) between the ground plane 86 and the zone 42.

the semi-conducting zone of the component 84 is formed by a lateral prolongation of the well 34 beyond the trench 90, extending vertically as far as the trench 46.

The circuit 80 furthermore comprises a thyristor 96, formed by the zones 22, 66, the wells 14 and 34 and the ground plane 86.

In this example, the transistor 94 is of NPN type.

The diodes 20 and 40, the transistors 74 and 94 and the thyristor 96 are here used to form an electrical protection device for the transistors 8 and 30 of the circuit 80 which is distinct from that of the circuits 2 and 60. The use of the thyristor 96 in this protection device makes it possible to improve the evacuation of the electric current originating from an electrostatic discharge.

Figure 17:
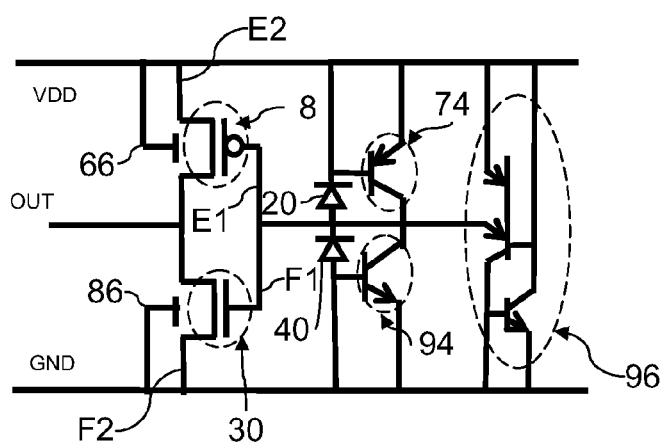
FIG. 17 is an electrical diagram corresponding to the circuit of FIG. 16 according to a first embodiment.

FIG. 17 represents an exemplary use of the device for protecting the circuit 80, here connected so as to protect more specifically the input IN of the circuit 80. For this purpose:

the electrodes E1 and F1 correspond, respectively, to the gates of the transistors 8 and 30;

the ground planes 66 and 86 are connected electrically, respectively, to the electrodes E2 and F2;

the anodes of the diodes 20 and 40 are, respectively, connected electrically to the electrodes E1 and F2;

the cathodes of the diodes 20 and 40 are, respectively, connected electrically to the electrodes E2 and F1;

the base of the transistor 74 is connected electrically to the cathode of the diode 20, the collector of the transistor 74 to the electrode El and the emitter of the transistor 74 to the electrode E2;

the base of the transistor 94 is connected electrically to the anode of the diode 40, the collector to the electrode F1 and the emitter to the electrode E2;

the anode of the thyristor 96 is connected electrically to the electrode F2, the cathode and the gate of the thyristor 96 are connected electrically to the electrode E2.

Figure 18:
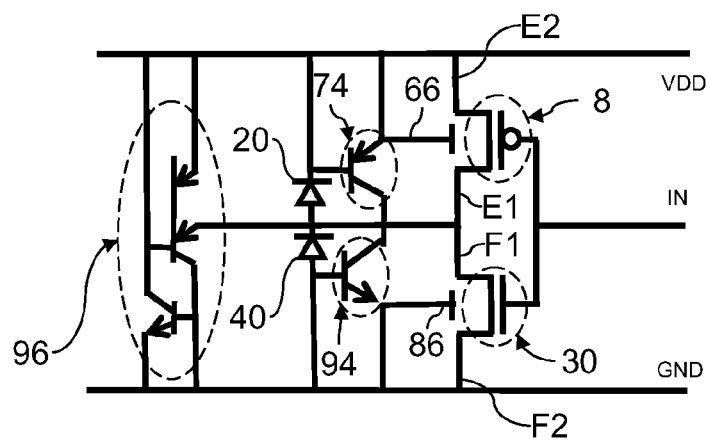
FIG. 18 is an electrical diagram corresponding to the circuit of FIG. 16 according to a second embodiment.

FIG. 18 represents another example of the device for protecting the circuit 80, here connected so as to protect more specifically the output OUT of the circuit 80. This circuit is identical to that described in FIG. 17, except that the electrodes E1 and F1 correspond, respectively, to the drains of the transistors 8 and 30.

Figure 19:
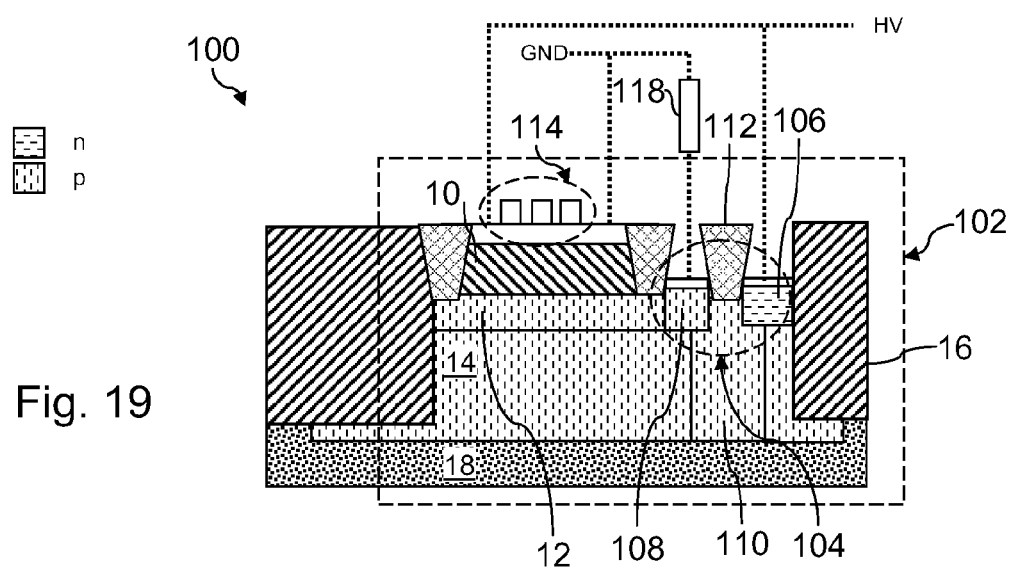
FIG. 19 illustrates another embodiment of the circuit of FIG. 1.

FIG. 19 represents an integrated circuit 100, fabricated on SOI and comprising a component 102. This 30 component 102 is identical to the component 4, except that the diode 20 is replaced with a Zener diode 104. For this purpose, the diode 104 comprises:

semi-conducting zones 106, 108 and 110, respectively, identical to the zones 22, 24 and 28, except that:

the zone 110 exhibits a doping of type p;

the zone 106 exhibits a doping of type n, with a dopants concentration of greater than or equal to $5*10^{17}$ cm$^{-3}$, to $10^{18}$cm$^{-3}$ or, preferably, to $1*10^{19}$ cm$^{-3}$.

an isolation trench 112, of identical depth, thickness and/or composition to the trench 26, separating the zones 106 and 108.

Advantageously, the diode 104 exhibits a Zener breakdown voltage, in absolute value, of greater than 2 Volts and less than 20 Volts, 15 Volts or 10 Volts. This breakdown voltage is adjustable during steps of design and/or fabrication of the circuit 100, in particular by adjusting the lateral dimension of the isolation trench 112 or of the dopants concentration of the semi-conducting zones forming the diode 104.

Advantageously when this lateral dimension is less than 250 nm or than 200 nm, the breakdown voltage of the diode 104 is governed essentially by the lateral dimension and no longer essentially by the said dopants concentration.

Here, the component 102 comprises, in place of the transistor 8, a plurality of MOS transistors of n-FET type identical to the transistor 8, this plurality including at least one first transistor 103. These transistors are electrically connected in cascode, forming a device 114. This device 114 extends electrically between an electrical ground GND of the circuit and a first electrode E1. This electrode E1 is taken here to a potential HV.

Advantageously, the zone 110 exhibits a dopants concentration of less than $10^{17}cm^{-3}$ or less than $5*10^{16}cm^{-3}$.

In this example, the diode 104 is used, in case of occurrence of an electrostatic discharge, to trigger a protection device 116. This device 116 is configured to short-circuit the device 114 and protect it against electrostatic discharges.

Figure 20:
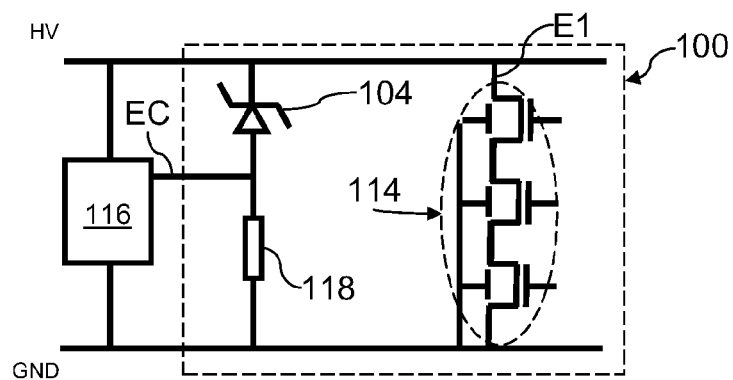
FIG. 20 is an electrical diagram corresponding to the circuit of FIG. 19.

For this purpose, as illustrated in FIG. 20, in this circuit:
the zone 108 is connected electrically to a control electrode EC of the device 116 on the one hand and to the ground plane 12, by way of a resistive dipole 118 on the other hand,
the ground plane 12 is connected electrically to the ground GND, and
the zone 106 is connected electrically to the electrode E1.

An exemplary operation of this protection device will now be briefly described. For example, during normal operation, the potential difference between HV and GND remains less than the Zener breakdown voltage of the diode 104. The diode 104 is then in a state not allowing electric current to flow through the branch of the circuit comprising the diode 104.

In the presence of an electrostatic discharge on the electrode E1, this potential difference may increase substantially, to the point of exceeding the Zener breakdown voltage of the diode 104. In this case, the diode 104 enters a state allowing current to flow towards the control electrode EC of the device 116, thereby making it possible to protect the device 114. The control electrode of the device 116 can be either the gate of a thyristor, the gate of a triac, the base of a bipolar transistor, or the gate of a field-effect transistor.

Figure 21:
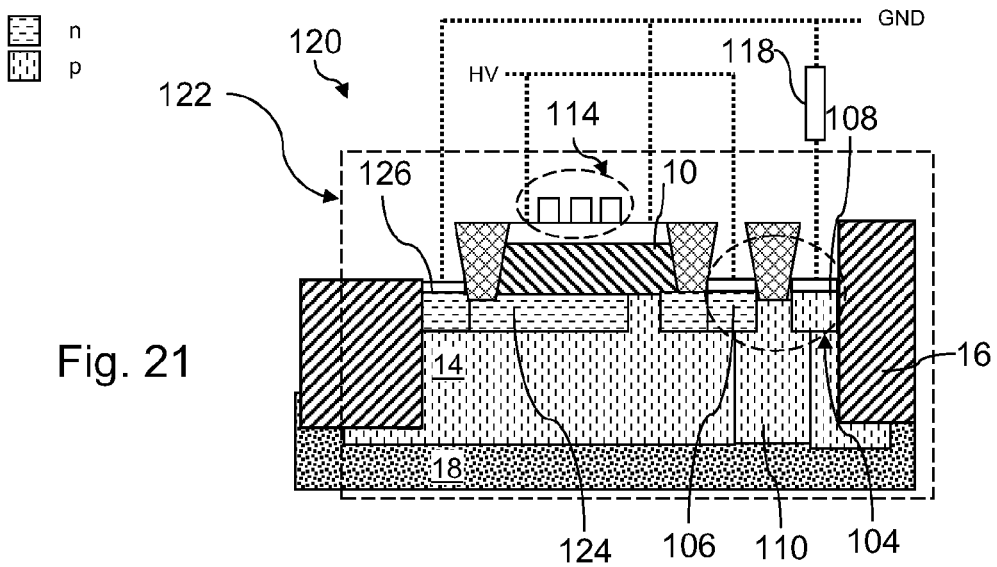
FIG. 21 illustrates another embodiment of the circuit of FIG. 19.
Figure 22:
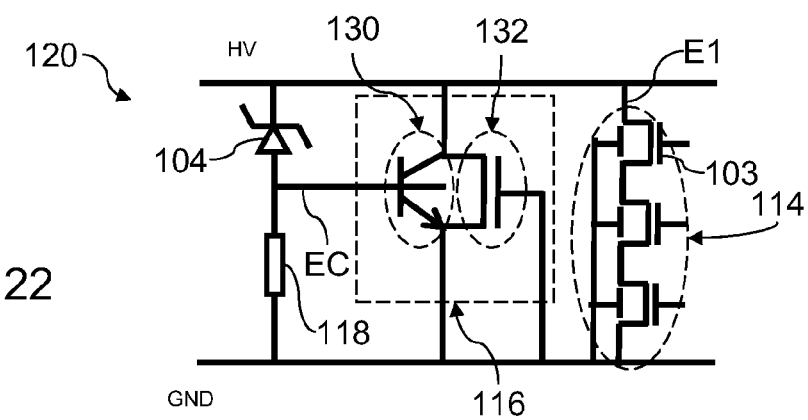
FIG. 22 illustrates an electrical diagram corresponding to the circuit of FIG. 21.

FIGS. 21 and 22 represent a circuit 120 comprising an example of a protection device 116. This circuit 120 comprises a component 122 identical to the component 102, except that:
the ground plane 12 is replaced with a ground plane 124 exhibiting a doping of type n,
the well 14 exhibits a doping of type p,
the component comprises a semi-conducting zone 126, exhibiting a doping of the same type as the zone 106, this zone 126 forming an electrical contact for applying an electrical bias to the ground plane 124,
the zone 126 is connected electrically to the zone 108 and to the ground GND in such a way that the zones 104, 106 and 126, form a bipolar transistor 130, here of NPN type. The device 116 also comprises a MOSFET transistor 132 exhibiting a channel doping of type n.

Figure 23:
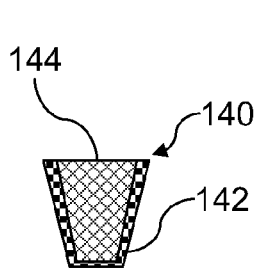
FIG. 23 illustrates another embodiment of an 10 isolation trench for the circuit of FIG. 1.

FIG. 23 illustrates an isolation trench 140 able to replace the trench 26. This trench 140 is similar to the trench 26, except that it comprises on its lateral walls a coating 142 of a second electrically insulating material. This second material is different from the electrically insulating material 144 forming the trench 26. This second coating is here a layer of silicon nitride $Si_3N_4$. The coating 142 exhibits, for example, a thickness of typically between 2 nm and 10 nm.

Thus, the risk of damaging the isolation trench during steps of the method for fabricating the circuit is reduced.

Figure 24:
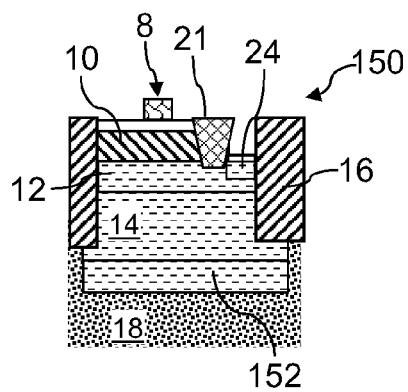
FIG. 24 illustrates another embodiment of the component of FIG. 2.

FIG. 24 represents a component 150, able to replace the component 4. This component 150 is substantially identical to the component 4 except that it furthermore comprises a deeply buried well 152. This well 152 is formed under the well 14 and plumb with this well 14. This well 152 exhibits a doping of type n. Here, this well 152 exhibits a concentration of dopants of between $10^{16}cm^{-3}$ and $10^{18}cm^{-3}$.

Numerous other embodiments are possible.

As a variant, the types of dopings of the transistors, of the ground planes, and of the respective wells of the components 4 and 6 can be interchanged. The same goes for the components 62 and 64, and for the components 82 and 84.

As a variant, in the circuit 2, the component 6 can be omitted. In this case, the protection device is different from that described.

The circuits 2, 60 and 80 can comprise a different number of transistors and/or of different nature from those described. These transistors can be connected so as to form a circuit different from the CMOS logic inverter described. The embodiments described for the zone 28 of the component 4 can apply to the third zone of the component 6.

As a variant, the circuits 2, 60, 80, 100 and 120 comprise a deeply buried well. This deeply buried well exhibits for example a doping of type n for a substrate 18 of type p, and is formed under and plumb with the wells 14 and 34. It is of course possible also to envisage a deeply buried well of type p for a substrate 18 of type n.

As a variant, a resumption of epitaxy can be performed on the zones 20, 22, 24, 42, 44, to avoid the difference in altitude with the transistors 8 and 30.

As a variant, the transistors 74 and 94 of the circuit 80 are connected so as to be in active states when the diode 20 is passing. In this case:
the collector and the emitter of the transistor 74 are connected electrically, respectively, to the electrodes E2 and E1;
the collector and the emitter of the transistor 94 are connected electrically, respectively, to the electrodes F2 and F1.

The threshold voltage ranges of the transistors 8 and can be different.

The gate lengths of the transistors 8 and 30 can be different from 20 nm. These gate lengths can, for example, be greater than 20 nm, or less than 20 nm.

The invention claimed is:
1. A semiconductor device comprising an integrated circuit, said integrated circuit comprising a first component comprising a first MOS FDSOI transistor, an UTBOX buried insulating layer disposed under said first transistor, a first semiconducting ground plane disposed under said UTBOX buried insulating layer, a first semiconducting well that is disposed under said first semiconducting ground plane, a first isolation trench made at a periphery of said first MOS FDSOI transistor and extending through said UTBOX buried insulating layer and into said first semiconducting well, a semiconducting substrate situated under said first semiconducting well, said first component further comprising a p-n diode made on a side of said first MOS FDSOI transistor and comprising first and second semiconducting zones of opposite doping, said first semiconducting zone being configured for electrical connection to a first electrode of said first MOS FDSOI transistor, wherein first and second semiconducting zones are coplanar with said first semicon- ducting ground plane, said first component further comprising a second isolation trench for separating said first and second semiconducting zones, said second isolation trench extending through said UTBOX buried insulating layer and into said first semiconducting ground plane and until a depth less than an interface between said first semiconducting ground plane and said first semiconducting well, and a third semiconducting zone under said second isolation trench forming a first junction between said first and second semiconducting zones, said semiconductor device further comprising a third isolation trench separating said first MOS FDSOI transistor from said first and second semiconducting zones, said third isolation trench extending through said UTBOX buried insulating layer and into said first semiconducting ground plane and until a depth less than a depth of an interface between said first semiconducting ground plane and said first semiconducting well.

2. The semiconductor device of claim 1, wherein said second semiconducting zone is configured for electrical connection to said first semiconducting ground plane and to a second electrode of said first MOS FDSOI transistor, and wherein said third semiconducting zone is a prolongation of a structure selected from the group consisting of said first semiconducting ground plane and said first semiconducting well.

3. The semiconductor device of claim 2, wherein a first bias voltage at one of an electrical ground and a supply voltage of said integrated circuit is configured for application to said second electrode.

4. The semiconductor device of claim 3, wherein said first semiconducting ground plane and said first semiconducting zone have a common type of doping, wherein said third isolation trench separates said first semiconducting ground plane from said first and second semiconducting zones, wherein said third semiconducting zone is a prolongation of said first semiconducting well, and wherein said first component further comprises a first electrical contact for applying said electrical bias directly to said first semiconducting ground plane, said third isolation trench and a fourth semiconducting zone forming a second junction between said first semiconducting zone and said first semiconducting ground plane so as to form a bipolar transistor between said semiconducting ground plane and said first semiconducting zone.

5. The semiconductor device of claim 4, further comprising a second component, wherein said second component comprises a second MOS transistor of FDSOI technology of opposite type to that of said first MOS FDSOI transistor, a second semiconducting ground plane disposed under said UTBOX buried insulating layer and having a doping that is opposite to that of said first semiconducting ground plane, a second semiconducting well that is formed plumb with said second semiconducting ground plane and having a doping that is opposite to that of said first semiconducting well, a second electrical contact for applying, directly to said second semiconducting ground plane, an electrical bias selected from the group consisting of said electrical ground and said supply voltage, and a fourth isolation trench disposed so as to separate said first and second components, said fourth isolation trench being made at a periphery of said second transistor and extending through said UTBOX buried insulating layer and into said first or second semiconducting wells.

6. The semiconductor device of claim 1, wherein said third semiconducting zone has p-type doping, wherein said first semiconducting zone has n-type doping with a dopant concentration of greater than or equal to $5 \cdot 10^{18}$ cm$^{-3}$, wherein said second semiconducting zone is configured for being connected electrically to said first semiconducting ground plane, wherein said first semiconducting ground plane is configured for electrical connection to an electrical ground of said integrated circuit, and wherein said second semiconducting zone is configured for electrical connection to a control electrode of a protection device configured to short-circuit said first MOS FDSOI transistor and to protect said MOS FDSOI transistor against electrostatic discharges.

7. The semiconductor device of claim 6, wherein said third semiconducting zone has a dopant concentration of less than $5 \cdot 10^{16}$ cm$^{-3}$.

8. The semiconductor device of claim 6, wherein said p-n diode has a Zener breakdown voltage having a magnitude of greater than two volts and less than ten volts, and wherein said first MOS FDSOI transistor is incorporated into a cascode device, said cascode device extending electrically between said ground of said integrated circuit and said first electrode.

9. The semiconductor device of claim 6, further comprising a protection device, wherein said semiconducting ground plane has n-type doping, said semiconducting well has p-type doping, said first component comprises a fifth semiconducting zone, having a doping of the same type as that of said first semiconducting zone, said fifth semiconducting zone forming an electrical contact for applying an electrical bias to said semiconducting ground plane, wherein said fifth semiconducting zone is connected electrically to said second semiconducting zone and to said electrical ground of said integrated circuit to form a bipolar transistor, said bipolar transistor being a constituent of said protection device.

10. The semiconductor device of claim 1, wherein said second semiconducting zone and said first semiconducting well have a common dopant, and wherein a concentration of said dopant in said semiconducting zone is greater than or equal to $10^{19}$ cm$^{-3}$, and wherein said first semiconducting zone has a dopant that is opposite to said common dopant, and wherein said first semiconducting zone has a dopant concentration of greater than or equal to $10^{19}$ cm$^{-3}$.

11. The semiconductor device of claim 1, wherein said first and second semiconducting zones have a dopant concentration that is at least fifty times greater than a dopant concentration of said first semiconducting well.

12. The semiconductor device of claim 1, wherein said first semiconducting zone and said second semiconducting zone are separated by a distance that is greater than or equal to 100 nanometers.

13. The semiconductor device of claim 1, wherein said second isolation trench extends into said first semiconducting ground plane until a depth of less than or equal to 80 nanometers below an interface separating said buried oxide layer from said first semiconducting ground plane.

14. The semiconductor device claim 1, wherein said second isolation trench comprises an insulating coating including silicon nitride $Si_3N_4$, said insulating coating covering lateral walls of said second isolation trench.

15. The semiconductor device of claim 1, wherein said first component further comprises a deeply buried well having n-type doping, said deeply buried well being formed under and plumb with said first semiconducting well.

16. The semiconductor device of claim 1, wherein said second semiconducting zone is configured for electrical connection to said first semiconducting ground plane and to a second electrode of said first MOS FDSOI transistor, and wherein said third semiconducting zone is a prolongation of said first semiconducting ground plane.

17. The semiconductor device of claim 1, wherein said second semiconducting zone is configured for electrical connection to said first semiconducting ground plane and to a second electrode of said first MOS FDSOI transistor, and wherein said third semiconducting zone is a prolongation of said first semiconducting well.

* * * * *